United States Patent
Wang et al.

(10) Patent No.: US 6,180,484 B1
(45) Date of Patent: Jan. 30, 2001

(54) CHEMICAL PLASMA TREATMENT FOR ROUNDING TUNGSTEN SURFACE SPIRES

(75) Inventors: Kun-Chih Wang, Taipei; Wen-Yi Hsieh, Hsinchu, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/140,776

(22) Filed: Aug. 26, 1998

(51) Int. Cl.$^7$ .................................................. H01L 21/20
(52) U.S. Cl. ......................... 438/398; 438/396; 438/253
(58) Field of Search ................................. 438/398, 360, 438/361, 362, 363, 364, 365, 253, 254, 255, 396; 437/60, 197, 198, 199; 257/306, 308, 384

(56) References Cited

U.S. PATENT DOCUMENTS

| | | | |
|---|---|---|---|
| 5,164,330 | * 11/1992 | Davis et al. | 437/192 |
| 5,200,635 | * 4/1993 | Kaga et al. | 257/306 |
| 5,474,949 | * 12/1995 | Hirao et al. | 437/60 |
| 5,661,068 | * 8/1997 | Hirao et al. | 438/398 |
| 5,691,219 | * 11/1997 | Kawakubo et al. | 437/52 |
| 5,691,223 | * 11/1997 | Pittkoun et al. | 437/52 |
| 5,693,557 | * 12/1997 | Hirao et al. | 437/60 |
| 5,780,339 | * 7/1998 | Liu et al. | 438/253 |
| 5,851,878 | * 1/1999 | Huang | 438/255 |
| 5,858,853 | * 1/1999 | Shishiguchi et al. | 438/398 |
| 5,899,735 | * 5/1999 | Tseng | 438/592 |

* cited by examiner

*Primary Examiner*—Charles Bowers
*Assistant Examiner*—Laura M Schillinger

(57) ABSTRACT

The present invention proposes a method for forming a tungsten film with a good surface property and utilizes a chemical plasma treatment to round the tungsten surface and to improve the leakage issue of tungsten conductive film. A fabrication of a DRAM cell capacitor with tungsten bottom electrode is described for a preferred embodiment. Forming an inter-layer dielectric on a semiconductor substrate, a tungsten layer is formed thereon. A chemical plasma treatment is carried out to round the tungsten surface spires and result in a better surface properties. The tungsten layer is patterned to serve as the bottom electrode, and another dielectric layer is formed to cover the bottom electrode of tungsten. Finally, the top storage electrode is formed to finish the present process.

3 Claims, 3 Drawing Sheets

CHEMICAL PLASMA TREATMENT FOR ROUNDING TUNGSTEN SURFACE SPIRES

BACKGROUND OF THE INVENTION

1. Field of the Invention

The present invention relates to a tungsten forming process, and more especially, to a method using chemical plasma treatment to improve the tungsten surface property.

2. Description of the Prior Art

In the electronic and semiconductor industry, conductive materials are applied to be the electrodes of designed devices and the contacts or connections between them. As one of the widely used conductive metal materials in modern semiconductor integrated circuit technology, tungsten is employed in variety of semiconductor structure, including contact barriers, MOS gate interconnects, and so on.

In comparison with other high electrical conductivity metals like aluminum, tungsten is not the most preferred material for conductive layer such as electrodes or interconnects due to its higher electrical resistivity. With the benefits of low electrical resistivity and compatibility with the matrix substance of silicon dioxide, aluminum is emerged as the most important material for the application of interconnects. But aluminum metallization for interconnects suffers from its inability to withstand high temperature processing, which precludes its use in self-aligned MOS processing. This is not the case for tungsten. The applicability of tungsten to VLSI interconnect application has been considered, and extensive efforts have been directed towards developing the chemical vapor deposition (CVD) of tungsten thin film for such application. Processes for forming CVD-tungsten films both in selective and blanket deposition modes have been successfully pursued.

The chemical vapor deposition of tungsten is generally performed with the well-suited source gas of tungsten hexafluoride, $WF_6$. Tungsten hexafluoride can be reduced by silicon, hydrogen or silane. The reaction equations are list as follows. The silicon reduction is given by

  (1)

The hydrogen reduction is given by

  (2)

The silane reduction is given by

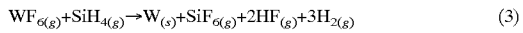  (3)

or

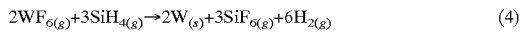  (4)

In addition, tungsten hexafluoride can be reduced by Al and Ti through

  (5)

  (6)

In practice, the process is more complex, with several intermediate reaction products such $WF_4$ and $WF_5$ involved. Other source gases such as $WCl_6$ have also been employed in the hydrogen reduction.

CVD-tungsten appears to be an excellent candidate material for interconnect applications because of its advantaged properties of low resistivity, low stress, and so on. For example, tungsten has a high melting point at the temperature of about 3410° C., and it makes the following high temperature processes possible. The thermal expansion coefficient of tungsten, which closely matches that of silicon, is also a benefit, because it can reduce the stress between tungsten film and silicon. Moreover, tungsten has good electromigration resistance and can form low resistance contacts to silicon. Tungsten has none of the stoichiometry control problem, and that often plague silicides. Most important, tungsten deposited by chemical vapor deposition (CVD) exhibits excellent conformal step coverage, which is a serious problem to the better conductor, aluminum.

Due to the excellent deposition conformability, the most successfully commercial application of tungsten is contact hold filling, which is usually referred as metal plug process and wherein sputtered aluminum is not suitable because of its poor step coverage. In addition, tungsten films have found application as bottom electrodes of the capacitors of dynamic random access memory (DRAM) cells and low-resistance gate interconnections. Moreover, contact barrier materials and ohmic contacts are also considered uses for tungsten.

With all the advantages mentioned above, tungsten still suffers from surface problem when it is used to be the materials of electrodes or interconnecting lines. Although the grain size is not large, tungsten grows into ragged morphology that is shown in FIG. 1, wherein illustrating a semiconductor substrate 10 and deposited tungsten layer 20. As can be seen, the surface of the tungsten layer 20 consists of the as-grown crystal facets with no preferred orientation everywhere. Spires is formed all over the surface and will enhance the local electric field, which results in decrease of the breakdown voltage and increase of leakage current for the conductive layer. Furthermore, rugged surface has poor reflectivity and will cause patterning difficult due to the random reflection of light during the photolithography process.

SUMMARY OF THE INVENTION

A method for forming a tungsten film with a good surface property is disclosed. This method utilizes a chemical plasma treatment to round the tungsten surface and to improve the leakage issue of tungsten conductive film. A preferred embodiment for fabricating a capacitor of a DRAM cell with tungsten bottom storage electrode is described as follows.

Forming an inter-layer dielectric on a semiconductor substrate and the contact hole pattern is formed in this inter-layer dielectric. A conductive layer of tungsten with a glue layer is then formed on the inter-layer dielectric and fills the contact hole. A chemical plasma treatment is now carried out to round the tungsten surface spires and result in a better surface properties. After patterning the tungsten layer to serve as the bottom electrode of a DRAM storage capacitor, another dielectric layer is formed on the substrate and covers the bottom electrode of tungsten. Finally, the top storage electrode is formed to finish the present process. A DRAM cell capacitor constructed of a tungsten bottom storage electrode, a dielectric layer and a top storage electrode is fabricated on a semiconductor substrate with electrode-dielectric interface rounded every segment.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a method for forming a tungsten film with a good surface property. The method described here includes many process steps well known in the art like photolithography, etching or chemical vapor deposition (CVD) which are not discussed in detail. In addition, the present invention utilizes a chemical plasma treatment to round the tungsten surface spires for better surface properties and therefore improve the leakage issue of tungsten conductive film.

Figure 1:
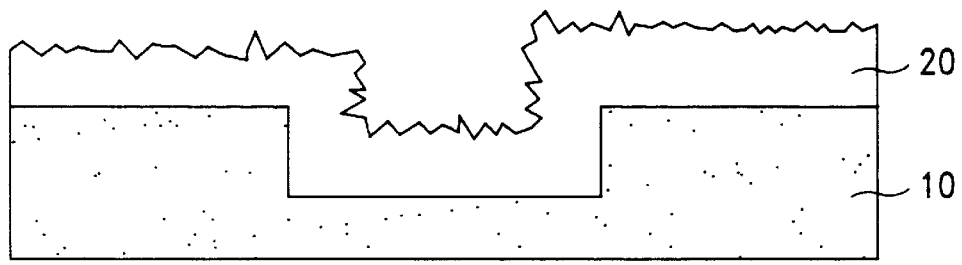
FIG. 1 is a cross-sectional view of a semiconductor wafer illustrating the ragged surface of a tungsten layer deposited on the substrate according to the prior art.
Figure 2:
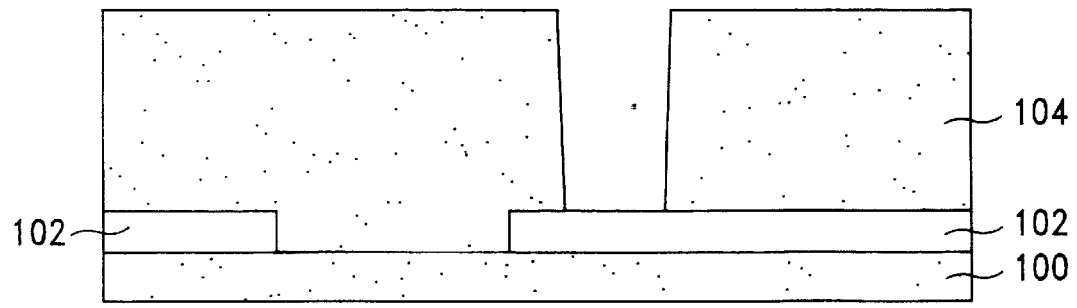
FIG. 2 is a cross-sectional view of a semiconductor wafer illustrating the step of defining a contact-hole pattern on the substrate according to the present invention.

A preferred embodiment of the present invention is to form a tungsten layer for bottom electrode of a DRAM storage capacitor, which is described as follows. Referring to FIG. 2, a semiconductor substrate 100, wherein the access transistors of those DRAM calls are built, is provided. The conductive layer 102 represents source/drain electrodes of those access transistors. Those bodies of the access transistors, including gate structures and channels, are not shown in the following figures for the cross-sectional view of the semiconductor substrate. Without limiting the spirit and the scope of the present invention, only the metallization processes and the capacitor profile are illustrated.

Over the conductive layer 102, a planarized inter-layer dielectric 104 is deposited to provide the isolation between access transistors and storage capacitors. The inter-layer dielectric 104 is formed of the dielectric materials such as silicon nitride or silicon oxide including phospho silicate glass (PSG), boro silicate glass (BSG), boro-phospho silicate glass (BPSG), tetra-ethyl-ortho-silicate oxide (TEOS-oxide), and so on. The suitable method to form this dielectric layer 104 can be low-pressure chemical vapor deposition (LPCVD) or plasma-enhanced chemical vapor deposition (PECVD). The contact hole region is then patterned in the inter-layer dielectric 104 by using a standard method of photolithography process followed by an anisotropic etching. A dry etching such as reactive ion etching (RIE) process is proper for this anisotropic etching. And the plasma source containing oxygen and fluorocarbon such as $CF_4$, $CHF_3$, $C_2F_6$ or $C_3F_8$ will be preferable etching gases for both oxide and nitride dielectric.

Figure 3:
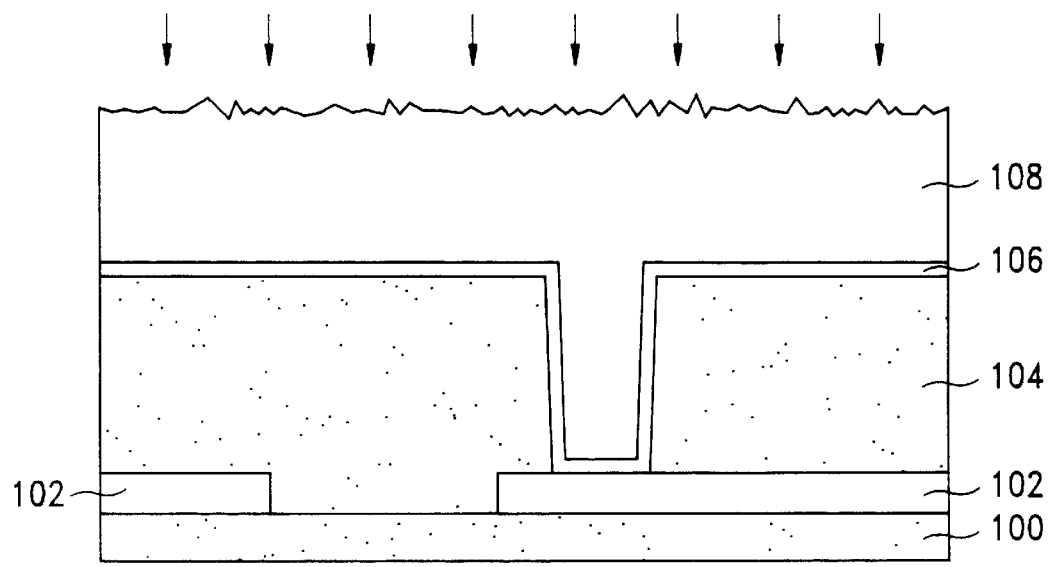
FIG. 3 is a cross-sectional view of a semiconductor wafer illustrating the step of forming a tungsten layer with a glue layer on the substrate according to the present invention.
Figure 4:
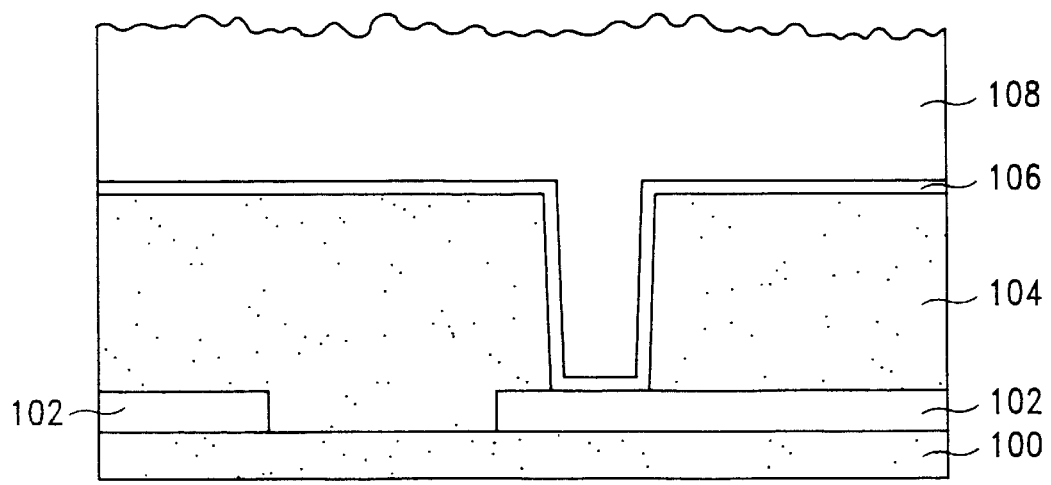
FIG. 4 is a cross-sectional view of a semiconductor wafer illustrating the steps of performing chemical plasma treatment to the tungsten surface according to the present invention.

Thereafter, as shown in FIG. 3, a glue layer 106 formed of titanium nitride (TiN) or titanium-tungsten (TiW) is sputtered conformally on the surface of the inter-layer dielectric 104 and the contact hole region. Then, the metal layer 108 of tungsten is formed by using chemical vapor deposition (CVD) on the glue layer 106 and fills the contact hole region. A blanket deposition for LPCVD at a temperature of about 300° C. to 550° C. is preferable for this tungsten layer forming. With such deposition process, a rugged tungsten surface with spires everywhere is formed. After creating this tungsten layer 108, a chemical plasma treatment of tungsten surface is performed with direction indicated by the arrows shown in FIG. 3. A preferable plasma source for this treatment is gases containing fluoride such as $SF_6/O_2$, $CF_4/O_2$, $NF_3/O_2$, and so on. By controlling the process conditions such as supplied voltage, performing time, gas concentration, and so on, the surface of the tungsten layer 108 is slightly sprinkled with plasma ions. A little among of the surface atoms is stripping and that results in rounding of those sharp spire tops and a smoother surface of the tungsten layer 108. The treated tungsten surface morphology is shown in FIG. 4.

Figure 5:
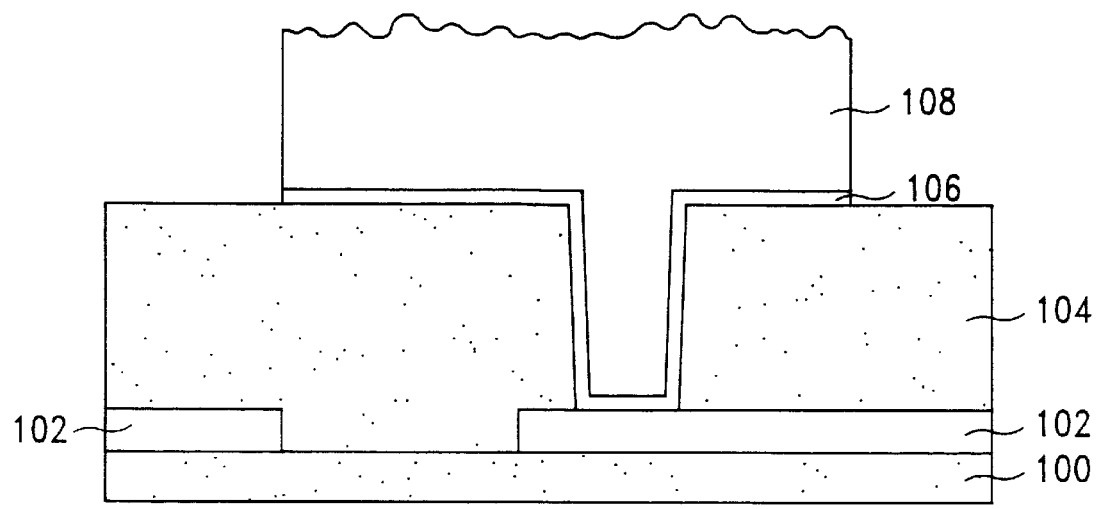
FIG. 5 is a cross-sectional view of a semiconductor wafer illustrating the steps of patterning the tungsten layer according to the present invention.
Figure 6:
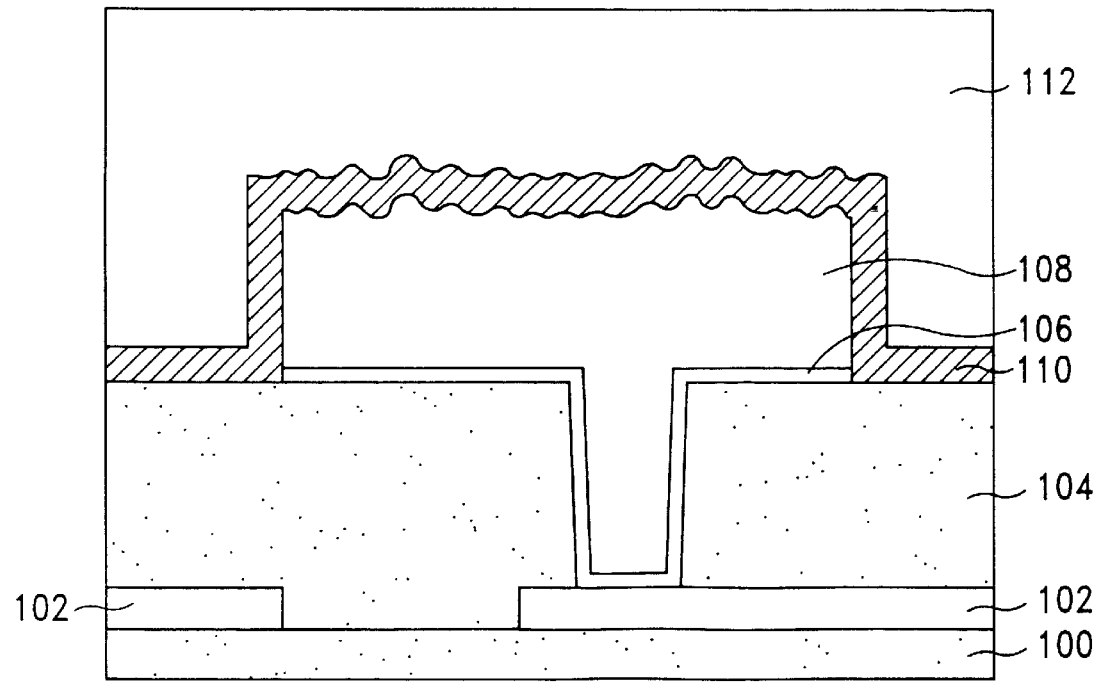
FIG. 6 is a cross-sectional view of a semiconductor wafer illustrating the steps of forming a dielectric layer and a top electrode according to the present invention.

Turning next to FIG. 5, after the chemical plasma surface treatment is done, the tungsten layer 108 is patterned with any designed shape to serve as the bottom storage electrode. A standard photolithography process including photoresist coating, exposure and development is employed for pattern defining and an anisotropic etching for pattern forming. FIG. 5 shows only a case with the simplest sharp, and a electrode with any sharp formed by processes not described in this embodiment is included with the spirit and scope of the present invention. Referring to FIG. 6, another dielectric layer 110 is then deposited conformally along the surface of the tungsten electrode 108. This dielectric layer 110 is preferably formed of a double film of silicon nitride/ silicon oxide, a triple film of silicon oxide/ silicon nitride/ silicon oxide, or any other high permittivity film such as tantalum pentoxide ($Ta_2O_5$) and BST. Finally, second conductive layer 112 formed of doped polysilicon, in-situ doped polysilicon, aluminum, copper, titanium, titanium nitride or tungsten is deposited over the dielectric layer 110 to serve as the top storage electrode. The capacitor of the DRAM cell is thus formed after the top storage electrode 112 is patterned. If the material of the top storage electrode 112 is selected to be tungsten, the same chemical plasma treatment can be repeated for better upper surface properties.

According to the method proposed above by the present invention, a DRAM cell capacitor constructed of tungsten bottom storage electrode 108, dielectric layer 110 and top storage electrode 112, is fabricated on a semiconductor substrate with electrode-dielectric interface rounded every segment. The sharp ends of the tungsten surface spires are rounded by the chemical plasma treatment. The local electric field will thus decrease, the leakage current induced from the sharp spires can be reduced, and the breakdown voltage rise up. Further, the following photolithography process for patterning will perform with a better accuracy. This chemical plasma treatment for tungsten surface can be applied not only in the electrodes of capacitor embodied above, but also in variety of tungsten application, for instance, interconnecting line or even gate electrodes.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a conductive layer on a semiconductor substrate, said method comprising:

forming a tungsten layer having a surface on said semiconductor substrate, whereby a plurality of spires are formed on the surface of the tungsten layer; and bombarding the surface of the tungsten layer with chemical plasma ions, thereby rounding the spires on the surface of the tungsten layer.

2. The method according to claim 1, wherein a dielectric layer selected from the group consisting of BST, a double film of silicon nitride and silicon oxide, and a triple film of silicon oxide, silicon nitride and silicon oxide, is formed along the tungsten layer.

3. The method according to claim 2, wherein a second storage electrode formed of a material selected from the group consisting of aluminum, copper, titanium, titanium nitride and tungsten, is formed along the dielectric layer.

* * * * *